(12) United States Patent
Sakashita

(10) Patent No.: US 6,930,875 B2
(45) Date of Patent: Aug. 16, 2005

(54) MULTI-LAYERED UNIT

(75) Inventor: Yukio Sakashita, Tokyo (JP)

(73) Assignee: TDK Corporation, Tokyo (JP)

( * ) Notice: Subject to any disclaimer, the term of this patent is extended or adjusted under 35 U.S.C. 154(b) by 19 days.

(21) Appl. No.: 10/460,763

(22) Filed: Jun. 12, 2003

(65) Prior Publication Data

US 2004/0252440 A1 Dec. 16, 2004

(51) Int. Cl.$^7$ .............................................. H01G 4/228
(52) U.S. Cl. .............................. 361/306.3; 361/306.1; 361/321.1; 361/321.4; 361/311; 361/313; 361/328
(58) Field of Search ........................... 361/306.3, 306.1, 361/321.1, 321.4, 320, 311, 313, 328, 329, 330; 438/239, 253, 256, 386

(56) References Cited

U.S. PATENT DOCUMENTS

| | | | | |
|---|---|---|---|---|
| 5,206,788 A | * | 4/1993 | Larson et al. ................ | 361/313 |
| 5,248,564 A | | 9/1993 | Ramesh ........................ | 428/688 |
| 5,426,075 A | * | 6/1995 | Perino et al. .................. | 438/3 |
| 5,879,956 A | | 3/1999 | Seon et al. ..................... | 438/3 |
| 5,994,276 A | | 11/1999 | Hughes et al. ............... | 505/238 |
| 6,096,343 A | | 8/2000 | Gergely et al. .............. | 424/499 |
| 6,096,434 A | | 8/2000 | Yano et al. .................. | 428/446 |
| 6,194,227 B1 | * | 2/2001 | Hase ............................. | 438/3 |
| 6,194,753 B1 | | 2/2001 | Seon et al. .................. | 257/295 |
| 6,287,969 B1 | | 9/2001 | Hughes et al. .............. | 438/687 |
| 6,303,231 B1 | * | 10/2001 | Sawada et al. ............. | 428/470 |
| 6,387,712 B1 | | 5/2002 | Yano et al. ..................... | 438/3 |
| 2003/0119212 A1 | * | 6/2003 | Nishihara et al. .............. | 438/3 |
| 2003/0136998 A1 | | 7/2003 | Baniecki et al. ............ | 257/310 |
| 2004/0029399 A1 | * | 2/2004 | Honma et al. ............... | 438/778 |

FOREIGN PATENT DOCUMENTS

| | | |
|---|---|---|
| JP | 56-144523 | 11/1981 |
| JP | 05-335173 | 12/1993 |
| JP | 05/335174 | 12/1993 |
| JP | 11-214245 | 8/1999 |
| JP | 2000-124056 | 4/2000 |

OTHER PUBLICATIONS

Cho, H. et al., "Improvement of Dielectric Properties of (Ba,Sr)TiO$_3$ Thin Films Deposited by Pulse Injection Chemical Vapor Deposition," Appl. Phys. Lett. 72(7):786–788, Feb. 1998.

Choopun, S. et al., "Low–Temperature Growth of Bi$_4$Ti$_3$O$_{12}$ Epitaxial Films on SrTiO$_3$(001) and Bi$_2$Sr$_2$CaCu$_2$O$_8$(001) Single Crystals by Laser Molecular Beam Epitaxy," Appl. Phys. Lett. 67(8):1072–1074, Aug. 1995.

(Continued)

Primary Examiner—Anthony Dinkins
Assistant Examiner—Nguyen T. Ha
(74) Attorney, Agent, or Firm—Seed IP Law Group PLLC

(57) ABSTRACT

A multi-layered unit according to the present invention includes a support substrate formed of a material which has conductivity and on which a dielectric material containing a bismuth layer structured compound can be epitaxially grown, at least the surface thereof being oriented in the [001] direction, and a dielectric layer formed by epitaxially growing a dielectric material containing a bismuth layer structured compound on the support substrate and formed of a dielectric material containing a bismuth layer structured compound oriented in the [001] direction. Since the thus constituted multi-layered unit includes the dielectric layer containing a bismuth layer structured compound oriented in the c axis direction, in the case of, for example, providing an upper electrode on the dielectric layer to form a thin film capacitor and applying a voltage between the electrode layer and the upper electrode, the direction of the electric field substantially coincides with the c axis of the bismuth layer structured compound contained in the dielectric layer. As a result, since the ferroelectric property of the bismuth layer structured compound contained in the dielectric layer can be suppressed and the paraelectric property thereof can be fully exhibited, it is possible to fabricate a thin film capacitor having a small size, large capacitance and an excellent dielectric characteristic.

21 Claims, 2 Drawing Sheets

OTHER PUBLICATIONS

Sakashita, Y. et al., "Dependence of Electrical Properties on Film Thickness in Pb($Zr_xTi_{1-x}$)$O_3$ Thin Films Produced by Metalorganic Chemical Vapor Deposition," *J. Appl. Phys.* 73(11):7857–7863, Jun. 1993.

Tabata, H. et al., "Formation of Bi–Based Layered Perovskite Oxide Films by a Laser Ablation Technique," *Jpn. J. Appl. Phys.* 34(9B):5146–5149, Sep. 1995.

Takenaka, T., "Study on the Particle Orientation of Bismuth Layer Structured Ferroelectric Ceramics and their Application to Piezoelectric or Pyroelectric Materials," Engineering Doctoral Thesis, University of Kyoto, 1984, pp. 1–170.

Takeshima, Y. et al., "Thickness Dependence of Characteristics for (Ba,Sr)$TiO_3$ Thin Films Prepared by Metalorganic Chemical Vapor Deposition," *Jpn. J. Appl. Phys.* 39(9B):5389–5392, Sep. 2000.

Watanabe, T. et al., "Film Thickness Dependence of Ferroelectric Properties of C–Axis–Oriented Epitaxial $Bi_4Ti_3O_{12}$ Thin Films Prepared by Metalorganic Chemical Vapor Deposition," *J. Appl. Phys.* 89(7):1–5, Apr. 2001.

* cited by examiner

MULTI-LAYERED UNIT

BACKGROUND OF THE INVENTION

The present invention relates to a multi-layered unit including an electrode and a dielectric layer and, particularly, to a multi-layered unit suitable for fabricating a thin film capacitor having a small size, large capacitance and an excellent dielectric characteristic and suitable for fabricating an inorganic EL (electro-luminescence) device capable of emitting light having high luminescence.

DESCRIPTION OF THE PRIOR ART

Recently, the operating frequency of LSIs (Large Scale Integrated circuits), typically CPUs (Central Processing Units), has become higher and higher. In the LSI having a high operating frequency, power supply noise is very likely to be generated, and once power supply noise occurs, a voltage drop occurs due to parasitic resistance and parasitic inductance of the power supply wiring, causing the LSI to operate erroneously.

In order to prevent such a voltage drop caused by power supply noise, a decoupling capacitor is generally connected between the terminals of the LSI power supply. In the case where a decoupling capacitor is connected between the terminals of the LSI power supply, the impedance of the power supply wiring decreases to effectively prevent voltage drop caused by power supply noise.

The impedance required of the power supply wiring is proportional to the operating voltage of the LSI and inversely proportional to the integration density of the LSI, the switching current of the LSI and the operating frequency of the LSI. Therefore, in current LSIs, which have high integration density, low operating voltage and high operating frequency, the impedance required of the power supply wiring is extremely low.

In order to achieve such low impedance of the power supply wiring, it is necessary to increase the capacitance of the decoupling capacitor and considerably lower the inductance of the wiring connecting the terminals of the LSI power supply and the decoupling capacitor.

As a decoupling capacitor having a large capacitance, an electrolytic capacitor or a multilayer ceramic capacitor is generally employed. However, since the size of an electrolytic capacitor or multilayer ceramic capacitor is relatively large, it is difficult to integrate it with an LSI. Therefore, the electrolytic capacitor or multilayer ceramic capacitor has to be mounted on a circuit substrate independently of the LSI and, as a result, the length of wiring for connecting the terminals of the LSI power supply and the decoupling capacitor is inevitably long. Accordingly, in the case where an electrolytic capacitor or a multilayer ceramic capacitor is employed as a decoupling capacitor, it is difficult to lower the inductance of the wiring for connecting the terminals of the LSI power supply and the decoupling capacitor.

In order to shorten the wiring for connecting the terminals of the LSI power supply and the decoupling capacitor, use of a thin film capacitor having a smaller size than that of an electrolytic capacitor or a multilayer ceramic capacitor is suitable.

Japanese Patent Application Laid Open No. 2001-15382 discloses a thin film capacitor having a small size and large capacitance which employs PZT, PLZT, (Ba, Sr) $TiO_3$ (BST), $Ta_2O_5$ or the like as a dielectric material.

However, the thin film capacitor employing any one of the above mentioned materials is disadvantageous in that the temperature characteristic thereof is poor. For example, since the dielectric constant of BST has a temperature dependency of −1000 to −4000 ppm/° C., in the case where BST is employed as a dielectric material, the capacitance of the thin film capacitor at 80° C. varies between −6% and −24% in comparison with that at 20° C. Therefore, a thin film capacitor employing BST as a dielectric material is not suitable for use as a decoupling capacitor for a high operating frequency LSI whose ambient temperature frequently reaches 80° C. or higher owing to heat generated by electric power consumption.

Furthermore, the dielectric constant of a dielectric thin film formed of any one of the above mentioned materials decreases as the thickness thereof decreases and the capacitance thereof greatly decreases when an electric field of 100 kV/cm, for example, is applied thereto. Therefore, in the case where any one of the above mentioned materials is used as a dielectric material for a thin film capacitor, it is difficult to simultaneously make the thin film capacitor small and the capacitance thereof great.

In addition, Moreover, since the surface roughness of a dielectric thin film formed of any one of the above mentioned materials is high, its insulation performance tends to be lowered when formed thin.

It might be thought possible to overcome these problems by using a bismuth layer structured compound as a dielectric material for a thin film capacitor. The bismuth layer structured compound is discussed by Tadashi Takenaka in "Study on the particle orientation of bismuth layer structured ferroelectric ceramics and their application to piezoelectric or pyroelectric materials" Engineering Doctoral Thesis at the University of Kyoto (1984), Chapter 3, pages 23 to 36.

It is known that the bismuth layer structured compound has an anisotropic crystal structure and behaves as a ferroelectric material but that the bismuth layer structured compound exhibits only weak property as a ferroelectric material and behaves like as a paraelectric material along a certain axis of orientation.

The property of the bismuth layer structured compound as a ferroelectric material is undesirable when the bismuth layer structured compound is utilized as a dielectric material for a thin film capacitor since it causes variation in dielectric constant. Therefore, when a bismuth layer structured compound is used as a dielectric material for a thin film capacitor, it is preferable that its paraelectric property can be fully exhibited.

Therefore, a need has been felt for the development of a thin film capacitor of small size, large capacitance and excellent dielectric characteristic that has a dielectric layer in which a bismuth layer structured compound oriented in the axis of orientation along which the bismuth layer structured compound exhibits only weak property as a ferroelectric material and behaves like a paraelectric material.

On the other hand, it is necessary in order to fabricate an inorganic EL (electro-luminescence) device for emitting light having high luminescence to provide a dielectric layer having a high insulating property between an electrode and an inorganic EL device and it is therefore required to develop an inorganic EL device provided with a dielectric layer in which a bismuth layer structured compound oriented in the axis of orientation along which the bismuth layer structured compound exhibits only weak property as a ferroelectric material and behaves like a paraelectric material.

SUMMARY OF THE INVENTION

It is therefore an object of the present invention to provide a multi-layered unit suitable for fabricating a thin film capacitor having a small size, large capacitance and an excellent dielectric characteristic and suitable for fabricating an inorganic EL (electro-luminescence) device capable of emitting light having high luminescence.

The above and other objects of the present invention can be accomplished by a multi-layered unit comprising a support substrate formed of a material which has conductivity and on which a dielectric material containing a bismuth layer structured compound can be epitaxially grown, at least the surface thereof being oriented in the [001] direction, and a dielectric layer formed by epitaxially growing a dielectric material containing a bismuth layer structured compound on the support substrate and formed of a dielectric material containing a bismuth layer structured compound oriented in the [001] direction.

In the present invention, the [001] direction as termed herein means the [001] direction of a cubic crystal, a tetragonal crystal, a monoclinic crystal or an orthorhombic crystal.

According to the present invention, since the support substrate is formed of a material which has conductivity and on which a dielectric material containing a bismuth layer structured compound can be epitaxially grown, at least the surface thereof being oriented in the [001] direction, the support substrate can serve as an electrode layer and a buffer layer and it is accordingly possible to epitaxially grow a dielectric material containing a bismuth layer structured compound on the support substrate and reliably form a dielectric layer containing a bismuth layer structured compound oriented in the [001] direction.

Therefore, according to the present invention, since the c axis of the bismuth layer structured compound contained in the dielectric layer can be oriented so as to be perpendicular to the support substrate, in the case of, for example, providing an upper electrode on the dielectric layer and applying a voltage between the electrode layer and the upper electrode, the direction of the electric field substantially coincides with the c axis of the bismuth layer structured compound contained in the dielectric layer. Accordingly, since the ferroelectric property of the bismuth layer structured compound contained in the dielectric layer can be suppressed and the paraelectric property thereof can be fully exhibited, it is possible to fabricate a thin film capacitor having a small size and large capacitance.

Furthermore, since the dielectric layer of the dielectric material containing the bismuth layer structured compound whose c axis orientation is improved has a high insulating property, it is possible to cause an inorganic. EL device to emit light in a desired manner and fabricate an inorganic EL device capable of emitting light having high luminescence by disposing the inorganic EL device on the dielectric layer of the multi-layered unit according to the present invention, disposing another electrode on the inorganic EL device and applying a voltage between the electrode layer and another electrode.

In the present invention, the dielectric material containing the bismuth layer structured compound may contain unavoidable impurities.

In the present invention, the material for forming the support substrate is not particularly limited insofar as it has conductivity and can epitaxially grow a dielectric material containing a bismuth layer structured compound thereon. Illustrative examples of a material for the support substrate include a metal such as platinum (Pt), ruthenium (Ru), rhodium (Rh), palladium (Pd), iridium (Ir), gold (Au), silver (Ag), copper (Cu), nickel (Ni) or the like, an alloy containing at least one of these metals as a principal component, a conductive oxide such as NdO, NbO, $RhO_2$, $OSO_2$, $IrO_2$, $RuO_2$, $SrMoO_3$, $SrRuO_3$, $CaRuO_3$, $SrVO_3$, $SrCrO_3$, $SrCoO_3$, $LaNiO_3$, Nb doped $SrTiO_3$ or the like, a mixture of these, or an oxide superconductor.

In the present invention, among oxide superconductors, a copper oxide superconductor having a $CuO_2$ plane is more preferably used for forming the electrode layer.

Illustrative examples of a copper oxide superconductor having a $CuO_2$ plane usable for forming the electrode layer include BSCCO (bismuth strontium calcium copper oxide) represented by the stoichiometric compositional formula: $Bi_2Sr_2Ca_{n-1}Cu_nO_{21}+4$ and YBCO (yttrium bismuth copper oxide) represented by the stoichiometric compositional formula: $YBa_2Cu_3O_7-\delta$.

In the present invention, it is not absolutely necessary for the degree F of orientation in the [001] direction, namely, c axis orientation of the material having conductivity and contained in the support substrate to be 100% but it is sufficient for the degree F of c axis orientation of the material to be equal to or more than 80%. It is more preferable for the degree of c axis orientation of the material to be equal to or more than 90% and it is much more preferable for the degree of c axis orientation of the material to be equal to or more than 95%.

The degree F of the c axis orientation of the material having conductivity is defined by the following formula (1).

$$F=(P-P_0)(1-P_0)\times 100 \tag{1}$$

In formula (1), $P_0$ is defined as the c-axis orientation ratio of polycrystal whose orientation is completely random, namely, a ratio $(\Sigma I_0(001)/\Sigma I_0(hkl))$ of the sum $\Sigma I_0(001)$ of reflection intensities $I_0(001)$ from the surface of [001] of polycrystal whose orientation is completely random to the sum $\Sigma I_0(hkl)$ of reflection intensities $I_0(hkl)$ from the respective crystal surfaces of [hkl] thereof and P is defined as the c-axis orientation ratio of the material having conductivity calculated using X-ray diffraction intensity, namely, a ratio $(\Sigma I(001)/\Sigma I(hkl))$ of the sum $\Sigma I(001)$ of reflection intensities $I(001)$ from the surface of [001] of the material having conductivity to the sum $\Sigma I(hkl)$ of reflection intensities $I(hkl)$ from the respective crystal surfaces of [hkl] thereof. The symbols h, k and l can assume an arbitrary integer value equal to or larger than 0.

In the above formula (1), since $P_0$ is a known constant, when the sum $\Sigma I(001)$ of reflection intensities $I(001)$ from the surface of [001] of the material having conductivity and the sum $\Sigma I(hkl)$ of reflection intensities $I(hkl)$ from the respective crystal surfaces of [hkl] are equal to each other, the degree F of the c axis orientation of the material having conductivity is equal to 100%.

In the case of directly forming an electrode layer made of platinum or the like on the support substrate made of fused quartz or the like, since the electrode layer tends to be oriented in the [111] direction, it is extremely difficult to epitaxially grow a dielectric material containing a bismuth layer structured compound on the electrode layer to form a dielectric layer of the dielectric material containing the bismuth layer structured compound oriented in the [001] direction, namely, the c axis direction. However, in the present invention, the support substrate is formed of a material which has conductivity and on which a dielectric material containing a bismuth layer structured compound can be epitaxially grown, at least the surface of which is oriented in the [001] direction and which can also serve as an electrode layer is employed and a dielectric material containing a bismuth layer structured compound is epitaxially grown on the support substrate at least the surface of which is oriented in the [001] direction to form a dielectric layer. It is therefore possible to reliably form a dielectric layer oriented in the [001] direction, namely, the c axis direction.

In the present invention, in the case where the support substrate is to be formed of platinum (Pt), ruthenium (Ru), rhodium (Rh), palladium (Pd), iridium (Ir), gold (Au), silver (Ag), copper (Cu), nickel (Ni) or the like, or an alloy containing at least one of these metals as a principal component, a buffer layer is first formed of a material having an anisotropic property and enabling epitaxial growth of crystals of a metal such as platinum (Pt), ruthenium (Ru) or the like or an alloy containing at least one of these metals as a principal component to form a support substrate serving as an electrode layer on another support substrate such as an amorphous substrate made of fused silica or the like, a polycrystal substrate made of ceramic, a heat-resistant glass substrate, a resin substrate or the like so as to be oriented in the [001] direction, namely, the c axis direction. Then, a support substrate serving an electrode is formed by epitaxially growing a metal such as platinum (Pt), ruthenium (Ru) or the like or an alloy containing at least one of these metals as a principal component and the buffer layer is peeled off the support substrate, thereby fabricating the support substrate oriented in the [001] direction.

On the other hand, in the present invention, in the case where the support substrate at least the surface of which is oriented in the [001] direction is to be formed of a single crystal conductive oxide, a mixture of single crystal conductive oxides or a single crystal oxide superconductor, the support substrate oriented in the [001] direction can be fabricated by selecting a plane in which a single crystal of a conductive oxide, a mixture of conductive oxides or an oxide superconductor is oriented in the [001] direction and cutting out the single crystal of a conductive oxide, a mixture of conductive oxides or an oxide superconductor.

Further, in the present invention, in the case where the support substrate at least the surface of which is oriented in the [001] direction is to be formed of a polycrystal conductive oxide, a mixture of polycrystal conductive oxides or a polycrystal oxide superconductor, the support substrate oriented in the [001] direction can be fabricated by orienting polycrystal particles of a conductive oxide, a mixture of conductive oxides or an oxide superconductor in the [001] direction using a hot working process such as a hot forging process, a hot press process or the like, selecting a plane in which the polycrystal of a conductive oxide, a mixture of conductive oxides or an oxide superconductor oriented in the [001] direction and cutting out the polycrystal of a conductive oxide, a mixture of conductive oxides or an oxide superconductor. When polycrystal particles of a conductive oxide, a mixture of conductive oxides or an oxide superconductor are oriented in the [001] direction using a hot working process such as a hot forging process, a hot press process or the like, if the degree F of the [001] orientation, namely, the c axis orientation, of the polycrystal particles is equal to or more than 90%, the polycrystal can be used as a support substrate without cutting it.

In the present invention, the multi-layered unit includes a dielectric layer formed of a dielectric material containing a bismuth layer structured compound oriented in the [001] orientation, namely, the c axis direction on the support substrate.

In the present invention, the dielectric layer is formed by epitaxially growing a dielectric material containing a bismuth layer structured compound on the support substrate.

Since the dielectric layer is formed by epitaxially growing a dielectric material containing a bismuth layer structured compound on the support substrate oriented in the [001] orientation, it is possible to reliably orient a bismuth layer structured compound contained in a dielectric material in the [001] orientation, namely, the c axis direction. Therefore, in the case where a thin film capacitor is fabricated using the multi-layered unit according to the present invention, since the bismuth layer structured compound does not function as a ferroelectric material but functions as a paraelectric material, it is possible to fabricate a thin film capacitor having a small size, large capacitance and an excellent dielectric characteristic using the multi-layered unit according to the present invention.

As the bismuth layer structured compound for forming the dielectric layer, a bismuth layer structured compound having an excellent characteristic as a capacitor material is selected.

The bismuth layer structured compound has a composition represented by the stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W). In the case where the symbol A and/or B includes two or more elements, the ratio of the elements can be arbitrarily determined.

As shown in FIG. 1, the bismuth layer structured compound has a layered structure formed by alternately laminating perovskite layers 1 each including perovskite lattices 1a made of (m−1) $ABO_3$ and $(Bi_2O_2)^{2+}$ layers 2.

The number of laminates each consisting of the perovskite layer 1 and the $(Bi_2O_2)^{2+}$ layer 2 is not particularly limited and it is sufficient for the bismuth layer structured compound to include at least one pair of $(Bi_2O_2)^{2+}$ layers 2 and one perovskite layer 1 sandwiched therebetween.

The c axis of the bismuth layer structured compound means the direction obtained by connecting the pair of $(Bi_2O_2)^{2+}$ layers 2, namely, the [001] direction.

Among the bismuth layer structured compounds represented by the above stoichiometric compositional formula, a bismuth layer structured compound having an excellent characteristic as a capacitor material is employed for forming a dielectric layer.

In the present invention, the dielectric material used for forming the dielectric layer is not particularly limited insofar as it has an excellent characteristic as a capacitor but a bismuth layer structured compound of the symbol m=4 in the above stoichiometric compositional formula, namely, one that is represented by the stoichiometric compositional formula: $(Bi_2O_2)^{2+}(A_3B_4O_{13})^{2-}$ or $Bi_2A_3B_4O_{15}$ is preferably used because each of them has an excellent property as a capacitor material.

In the present invention, it is not absolutely necessary for the degree F of orientation in the [001] direction, namely, c axis orientation of the bismuth layer structured compound to be 100% and it is sufficient for the degree F of c axis orientation to be equal to or more than 80%. It is more preferable for the degree of c axis orientation of the bismuth layer structured compound to be equal to or more than 90% and it is much more preferable for the degree of c axis orientation of the bismuth layer structured compound to be equal to or more than 95%.

The degree F of the bismuth layer structured compound is defined by the formula (1).

The dielectric characteristic of a dielectric layer can be markedly improved by orienting the bismuth layer structured compound in the [001] direction, namely, the c axis direction in this manner.

More specifically, in the case where a thin film capacitor is fabricated by forming, for example, an upper electrode on the dielectric layer of the multi-layered unit according to the present invention, even if the thickness of the dielectric layer is equal to or thinner than, for example, 100 nm, a thin film capacitor having a relatively high dielectric constant and low loss (tan $\delta$) can be obtained. Further, a thin film capacitor having an excellent leak characteristic, an improved breakdown voltage, an excellent temperature coefficient of the dielectric constant and an excellent surface smoothness can be obtained.

In the present invention, it is particularly preferable that the bismuth layer structured compound contained in the dielectric layer has a composition represented by the stoichiometric compositional formula: $Ca_xSr_{(1-x)}Bi_4Ti_4O_{15}$, where x is equal to or larger than 0 and equal to or smaller than 1. If the bismuth layer structured compound having such a composition is used, a dielectric layer having a relatively large dielectric constant can be obtained and the temperature characteristic thereof can be further improved.

In the present invention, parts of the elements represented by the symbols A or B in the stoichiometric compositional formula of the bismuth layer structured compound contained in the dielectric layer are preferably replaced with at least one element Re (yttrium (Y) or a rare-earth element) selected from a group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

The preferable amount of replacement by the element Re depends upon the value of the symbol m. For example, in the case where the symbol m is equal to 3, in the compositional formula: $Bi_2A_{(2-x)}Re_xB_3O_{12}$, x is preferably equal to or larger than 0.4 and equal to or smaller than 1.8 and more preferably equal to or larger than 1.0 and equal to or smaller than 1.4. If the amount of replacement by the element Re is determined within this range, the Curie temperature (phase transition temperature from ferroelectric to paraelectric) of the dielectric layer can be controlled preferably to be equal to or higher than $-100°$ C. and equal to or lower than $100°$ C. and more preferably to be equal to or higher than $-50°$ C. and equal to or lower than $50°$ C. If the Curie point is equal to or higher than $-100°$ C. and equal to or lower than $100°$ C., the dielectric constant of the dielectric thin film 6 increases. The Curie temperature can be measured by DSC (differential scanning calorimetry) or the like. If the Curie point becomes lower than room temperature ($25°$ C.), tan $\delta$ further decreases and as a result, the loss value Q further increases.

Furthermore, in the case where the symbol m is equal to 4, in the compositional formula: $Bi_2A_{(3-x)}Re_xB_4O_{15}$, x is preferably equal to or larger than 0.01 and equal to or smaller than 2.0 and more preferably equal to or larger than 0.1 and equal to or smaller than 1.0.

Although the dielectric layer of the multi-layered unit according to the present invention has an excellent leak characteristic even if it does not contain the element Re, it is possible to further improve the leak characteristic by replacing part of the elements represented by the symbols A or B with the element Re.

For example, even in the case where no part of the elements represented by the symbols A or B in the stoichiometric compositional formula of the bismuth layer structured compound is replaced with element Re, the leak current measured at the electric filed strength of 50 kV/cm can be controlled preferably to be equal to or lower than $1 \times 10^7$ A/cm$^2$ and more preferably to be equal to or lower than $5 \times 10^{-8}$ A/cm$^2$ and the short circuit ratio can be controlled preferably to be equal to or lower than 10% and more preferably to be equal to or lower than 5%. However, in the case where parts of the elements represented by the symbols A or B in the stoichiometric compositional formula of the bismuth layer structured compound are replaced with element Re, the leak current measured under the same condition can be controlled preferably to be equal to or lower than $5 \times 10^{-8}$ A/cm$^2$ and more preferably to be equal to or lower than $1 \times 10^{-8}$ A/cm$^2$ and the short circuit ratio can be controlled preferably to be equal to or lower than 5% and more preferably to be equal to or lower than 3%.

In the present invention, the dielectric layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like. Particularly, in the case where the dielectric layer has to be formed at a low temperature, a plasma CVD process, a photo-CVD process, a laser CVD process, a photo-CSD process, a laser CSD process or the like is preferably used for forming the dielectric layer.

The multi-layered unit including the support substrate and the 2.5 dielectric layer according to the present invention can be used not only as a component of a thin film capacitor but also as a unit for causing an inorganic EL device to emit light. Specifically, an insulating layer is necessary between the support substrate and an inorganic EL device in order to cause the inorganic EL device to emit light. Since a dielectric layer of a dielectric material containing a bismuth layer structured compound having an improved c axis orientation has a high insulating property, it is possible to cause an inorganic EL device to emit light in a desired manner by disposing the inorganic EL device on the dielectric layer, disposing another electrode on the inorganic EL device and applying a voltage between the support substrate and the other electrode.

The above and other objects and features of the present invention will become apparent from the following description made with reference to the accompanying drawings.

DESCRIPTION OF THE PREFERRED EMBODIMENTS

Figure 1:
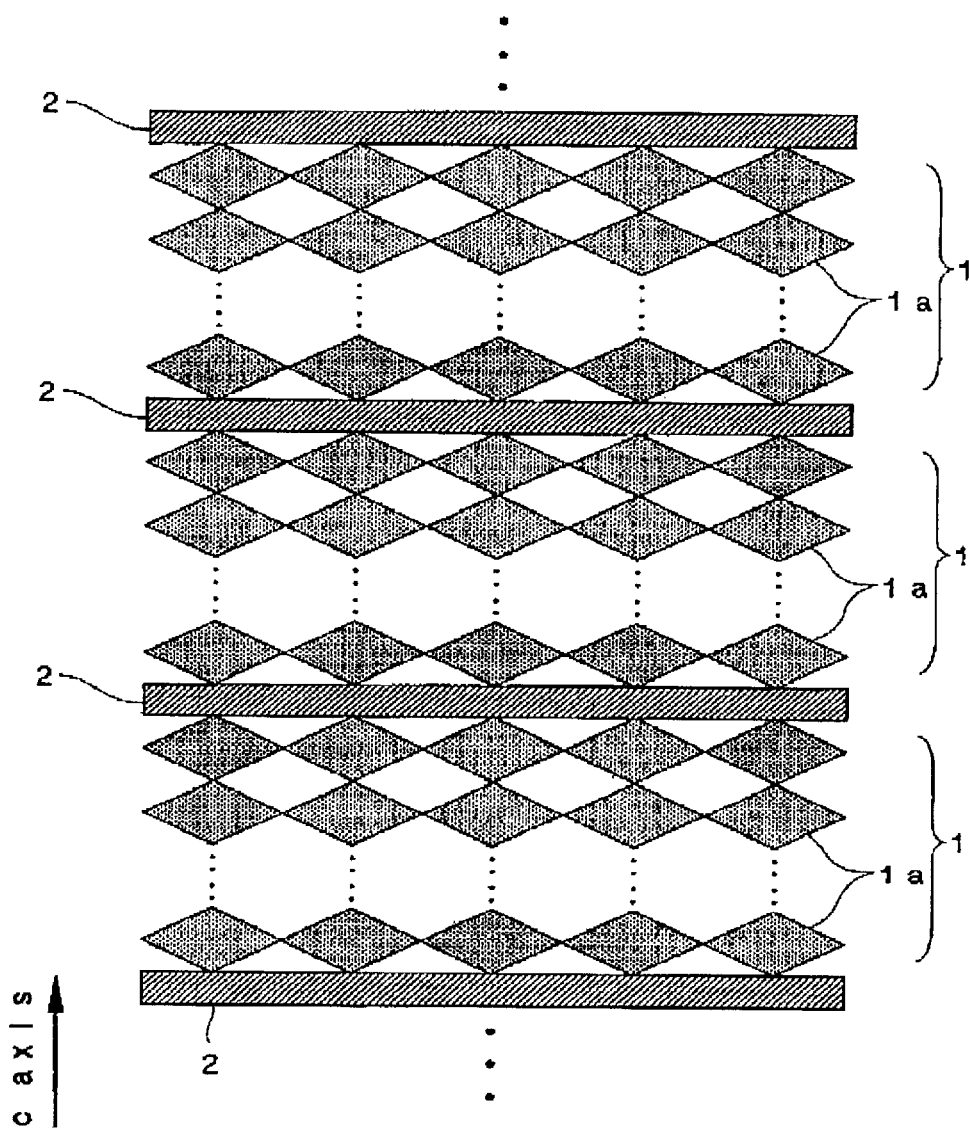
FIG. 1 is a drawing schematically showing the structure of a bismuth layer structured compound.
Figure 2:
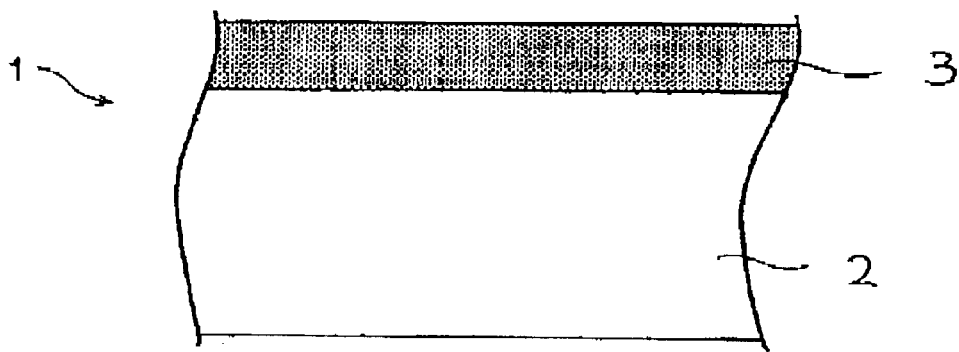
FIG. 2 is a schematic partial cross-sectional view showing a multi-layered unit which is a preferred embodiment of the present invention.

FIG. 2 is a schematic partial cross-sectional view showing a multi-layered unit which is a preferred embodiment of the present invention.

As shown in FIG. 2, a multi-layered unit 1 according to this embodiment includes a dielectric layer 3 on a support substrate 2.

In this embodiment, the support substrate 2 of the multi-layered unit 1 is formed of platinum (Pt) and oriented in the [001] direction.

Therefore, the support substrate 2 serves not only as a support for mechanically supporting the multi-layered unit 1 but also as an electrode layer.

Further, since the support substrate 2 is formed of platinum (Pt) and oriented in the [001] direction, the support substrate 2 serves as an electrode layer and a buffer layer for ensuring that a dielectric layer 3 containing a bismuth layer structured compound oriented in the [001] direction, namely, the c axis direction, can be formed by epitaxially growing a dielectric material containing the bismuth layer structured compound thereon.

The thickness of the support substrate 2 is determined so as to have sufficient mechanical strength for mechanically supporting the multi-layered unit 1.

When the support substrate 2 oriented in the [001] direction is to be formed, a buffer layer is first formed of a material having an anisotropic property and enabling epitaxial growth of crystals of a metal such as platinum (Pt), ruthenium (Ru) or the like or an alloy containing at least one of these metals as a principal component to form a support substrate serving as an electrode layer on another support substrate such as an amorphous substrate made of fused silica or the like, a polycrystal substrate made of ceramic, a heat-resistant glass substrate, a resin substrate or the like so as to be oriented in the [001] direction, namely, the c axis direction. Then, a support substrate of platinum (Pt) is formed by epitaxially growing platinum (Pt) and the buffer layer is peeled off the support substrate, thereby fabricating the support substrate oriented in the [001] direction.

As shown in FIG. 2, the multi-layered unit 1 according to this embodiment includes a dielectric layer 3 formed on the support substrate 2.

In this embodiment, the dielectric layer 3 is formed of a dielectric material containing a bismuth layer structured compound represented by the stoichiometric compositional formula: $SrBi_4Ti_4O_{15}$ wherein the symbol m is equal to 4 and the symbol $A_3$ is equal to $Bi_2+Sr$ in the general stoichiometric compositional formula of the bismuth layer structured compounds and having an excellent property as a capacitor material.

In this embodiment, the dielectric layer 3 is formed on the support substrate 2 using a metal organic deposition (MOD) process.

Concretely, a toluene solution of 2-ethyl hexanoate Sr, a 2-ethyl hexanoate solution of 2-ethyl hexanoate Bi and a toluene solution of 2-ethyl hexanoate Ti are stoichiometrically mixed so that the mixture contains 1 mole of 2-ethyl hexanoate Sr, 4 moles of 2-ethyl hexanoate Bi and 4 moles of 2-ethyl hexanoate Ti and is diluted with toluene. The resultant constituent solution is coated on the support substrate 2 using a spin coating method and after drying the resultant dielectric layer 3 is tentatively baked at a temperature under which the dielectric layer 3 cannot be crystallized.

The same constituent solution is coated on the thus tentatively baked dielectric layer 3 using a spin coating method to form a coating layer and the coating layer is dried and tentatively baked. These operations are repeated.

When tentative baking is completed, the dielectric layer 3 is baked and a series of operations including coating, drying, tentative baking, coating, drying, tentative baking and baking are repeated until a dielectric layer 3 having a required thickness, for example, 100 nm is obtained.

During these processes, a dielectric material containing a bismuth layer structured compound is epitaxially grown and a dielectric layer 3 oriented in the [001] direction, namely, the c axis direction is formed.

According to this embodiment, since the multi-layered unit 1 includes the support 2 and the dielectric layer 3 formed on the support substrate 2 and the support substrate 2 has conductivity and a property of enabling epitaxial growth of a dielectric material containing a bismuth layer structured compound thereon and the surface thereof is oriented in the [001] direction, the support substrate 2 serves as a buffer layer. It is therefore possible to epitaxially grow a dielectric material containing a bismuth layer structured compound on the support substrate 2 and reliably form a dielectric layer 3 of the dielectric material containing a bismuth layer structured compound oriented in the [001] direction, namely, the c axis direction.

Therefore, according to this embodiment, since the multi-layered unit 1 includes a dielectric layer 3 formed of a dielectric material containing a bismuth layer structured compound oriented in the [001] direction, namely, the c axis direction, in the case of, for example, providing an upper electrode on the dielectric layer 3 of the multi-layered unit 1 according to this embodiment, thereby fabricating a thin film capacitor, and applying a voltage between the support substrate 2 and the upper electrode, the direction of the electric field substantially coincides with the c axis of the bismuth layer structured compound contained in the dielectric layer 3. As a result, since the ferroelectric property of the bismuth layer structured compound contained in the dielectric layer 3 can be suppressed and the paraelectric property thereof can be fully exhibited, it is possible to fabricate a thin film capacitor having a small size and large capacitance.

Further, according to this embodiment, since the multi-layered unit 1 includes a dielectric layer 3 formed of a dielectric material containing a bismuth layer structured compound oriented in the [001] direction, namely, the c axis direction, and the dielectric layer 3 containing the bismuth layer structured compound whose c axis orientation is improved has a high insulating property, the dielectric layer 3 can be made thinner. Therefore, it is possible to make a thin film capacitor much thinner.

Figure 3:
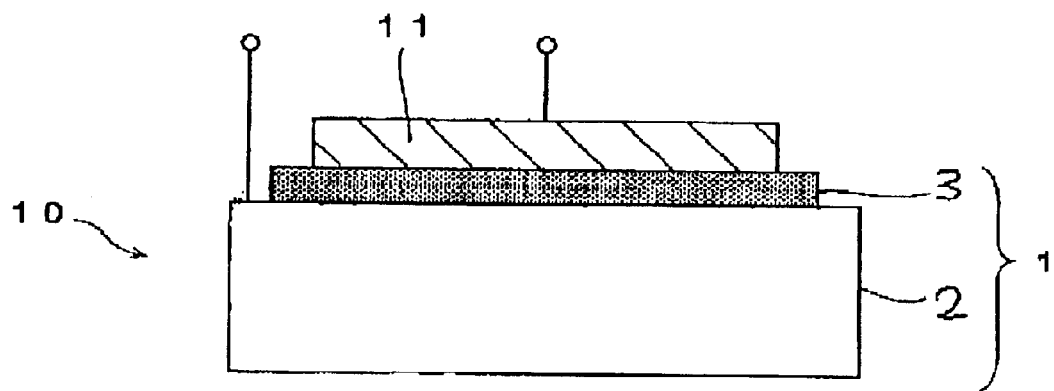
FIG. 3 is a schematic partial cross-sectional view showing a thin film capacitor fabricated using a multi-layered unit which is a preferred embodiment of the present invention.

FIG. 3 is a schematic partial cross-sectional view showing a thin film capacitor fabricated using a multi-layered unit which is a preferred embodiment of the present invention.

As shown in FIG. 3, the thin film capacitor 10 includes the multi-layered unit 1 shown in FIG. 2 and an upper electrode 11 formed on the dielectric layer 3 of the multi-layered unit 1.

In this embodiment, the support substrate 2 of the multi-layered unit 1 serves to ensure the mechanical strength of the entire thin film capacitor 10.

Further, the support substrate 2 serves as one of electrodes of the thin film capacitor 10 and a buffer layer for orienting the c axis of a bismuth layer structured compound contained in the dielectric layer 3 substantially parallel to an electric field.

In this embodiment, the dielectric layer 3 of the multi-layered unit 1 serves as a dielectric layer of the thin film capacitor 10.

In this embodiment, the upper electrode 11 serving as the other of the electrodes of the thin film capacitor 10 is formed on the dielectric layer 3 of the multi-layered unit 1.

The material for forming the upper electrode is not particularly limited insofar as it has conductivity and the upper electrode 11 can be formed of a metal such as platinum (Pt), ruthenium (Ru), rhodium (Rh), palladium (Pd), iridium (Ir), gold (Au), silver (Ag), copper (Cu), nickel (Ni) or the like, an alloy containing at least one of these metals as a principal component; a conductive oxide such as NdO, NbO, $RhO_2$, $OsO_2$, $IrO_2$, $RuO_2$, $SrMoO_3$, $SrRuO_3$, $CaRuO_3$, $SrVO_3$, $SrCrO_3$, $SrCoO_3$, $LaNiO_3$, Nb doped $SrTiO_3$ or the like, or a mixture of these and a conductive glass such as ITO. Further, unlike the support substrate 2 of the multi-layered unit 1, since it is unnecessary to consider the lattice mismatch with the material for forming the dielectric layer 3 when a material for forming the upper electrode 11 is to be selected and it can be formed at room temperature, the upper electrode 11 can be formed using a base metal such as iron (Fe), cobalt (Co) or the like or an alloy such as WSi, MoSi or the like. The thickness of the upper electrode 11 is not particularly limited insofar as it can serve as the other of the electrodes of the thin film capacitor 10 and the upper electrode 11 can be formed so as to have a thickness of 10 to 10,000 nm, for example.

The method for forming the upper electrode 11 is not particularly limited and the upper electrode 11 can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like. Among these, a sputtering process is preferable from the viewpoint of formation speed.

In the thus constituted thin layer capacitor 10, the bismuth layer structured compound contained in the dielectric layer 3 is oriented so that the c axis thereof is substantially perpendicular to the support substrate 2 and the upper electrode 11. Therefore, when a voltage is applied between the support substrate 2 and the upper electrode 11, the direction of the electric field substantially coincides with the c axis of the bismuth layer structured compound contained in the dielectric layer 3. As a result, since the ferroelectric property of the bismuth layer structured compound contained in the dielectric layer 3 can be suppressed and the paraelectric property thereof can be fully exhibited, it is possible to fabricate a thin film capacitor having a small size and large capacitance.

A thin film capacitor having such characteristics can be preferably utilized as a decoupling capacitor, in particular, a decoupling capacitor for an LSI having a high operating frequency.

The present invention has thus been shown and described with reference to specific embodiments. However, it should be noted that the present invention is in no way limited to the details of the described arrangements but changes and modifications may be made without departing from the scope of the appended claims.

For example, in the above described embodiments, although the support substrate 2 of the multi-layered unit 1 is formed of platinum (Pt), it is not absolutely necessary to form the support substrate 2 of platinum (Pt) and the material for forming the support substrate 2 is not particularly limited insofar as the support substrate 2 is formed of a material having conductivity and a property of enabling epitaxial growth of a dielectric material containing a bismuth layer structured compound thereon, at least the surface thereof is oriented in the [001] direction and it has a mechanical strength as a support substrate. The support substrate 2 may, for example, be formed not of platinum (Pt) but of a metal such as ruthenium (Ru), rhodium (Rh), palladium (Pd), iridium (Ir), gold (Au), silver (Ag), copper (Cu), nickel (Ni) or the like, an alloy containing at least one of these metals as a principal component, a conductive oxide such as NdO, NbO, $RhO_2$, $OsO_2$, $IrO_2$, $RuO_2$, $SrMoO_3$, $SrRuO_3$, $CaRuO_3$, $SrVO_3$, $SrCrO_3$, $SrCoO_3$, $LaNiO_3$, Nb doped $SrTiO_3$ or the like, or a mixture of these, an oxide superconductor such as BSCCO (bismuth strontium calcium copper oxide) represented by the stoichiometric compositional formula: $Bi_2Sr_2Ca_{n-1}Cu_nO_{2n+4}$, YBCO (yttrium bismuth copper oxide) represented by the stoichiometric compositional formula: $YBa_2Cu_3O_7\text{-}\delta$ or the like. In the present invention, in the case where a support substrate 2 is to be formed of a metal such as ruthenium (Ru), rhodium (Rh), palladium (Pd), iridium (Ir), gold (Au), silver (Ag), copper (Cu), nickel (Ni) or the like or an alloy containing at least one of these metals as a principal component, the support substrate 2 can be formed in a similar manner to that of fabricating the support substrate 2 of platinum (Pt). On the other hand, in the case where a support substrate 2 is to be formed of a single crystal conductive oxide, a mixture of single crystal conductive oxides or a single crystal oxide superconductor, the support substrate oriented in the [001] direction can be fabricated by selecting the plane in which a single crystal of a conductive oxide, a mixture of conductive oxides or an oxide superconductor is oriented in the [001] direction and cutting out the single crystal of a conductive oxide, a mixture of conductive oxides or an oxide superconductor. Moreover, in the case where a support substrate 2 is to be formed of a polycrystal conductive oxide, a mixture of polycrystal conductive oxides or a polycrystal oxide superconductor, the support substrate 2 oriented in the [001] direction can be fabricated by orienting polycrystal particles of a conductive oxide, a mixture of conductive oxides or an oxide superconductor in the [001] direction using a hot working process such as a hot forging process, a hot press process or the like, selecting the plane in which the polycrystal of a conductive oxide, a mixture of conductive oxides or an oxide superconductor is oriented in the [001] direction and cutting out the polycrystal of a conductive oxide, a mixture of conductive oxides or an oxide superconductor. When polycrystal particles of a conductive oxide, a mixture of conductive oxides 6 or an oxide superconductor are oriented in the [001] direction using a hot working process such as a hot forging process, a hot press process or the like, if the degree F of the [001] orientation, namely, the c axis orientation of the polycrystal particles is equal to or more than 90%, the polycrystal can be used as a support substrate 2 without cutting it.

Further, in the above described embodiments, the multi-layered unit 1 includes the dielectric layer 3 formed on the support substrate 2 of a dielectric material containing a bismuth layer structured compound having a composition represented by the stoichiometric compositional formula: $SrBi_4Ti_4O_{15}$, where the symbol m is equal to 4 and the symbol $A_3$ is replaced by $Bi_2$+Sr in the general stoichiometric compositional formula thereof. However, it is not absolutely necessary to form on the support substrate 2 a dielectric layer 4 of a dielectric material containing a bismuth layer structured compound having a composition represented by the stoichiometric compositional formula: $SrBi_4Ti_4O_{15}$ where the symbol m is equal to 4 and the symbol $A_3$ is replaced by $Bi_2$+Sr in the general stoichiometric compositional formula thereof and the dielectric layer 3 may be formed of a dielectric material containing a bismuth layer structured compound where the symbol m is not equal to 4 or a dielectric material containing another bismuth layer structured compound whose constituent elements are different from $SrBi_4Ti_4O_{15}$ insofar as it has an excellent characteristic as a capacitor material.

Furthermore, in the above described embodiments, although the dielectric layer 3 of the multi-layered unit 1 is formed using a metal-organic decomposition process (MOD), it is not absolutely necessary to form the dielectric layer 3 using a metal-organic decomposition process and the dielectric layer 3 may be formed using some other thin film forming process such as a vacuum deposition process, a sputtering process, a pulsed laser deposition process (PLD), a metal organic chemical vapor deposition process (MOCVD), other chemical solution deposition process (CSD process) such as a sol-gel process or the like.

Moreover, in the above described embodiments, although the multi-layered unit 1 is used as a component of a thin film capacitor, the multi-layered unit 1 can be used not only as a component of a thin film capacitor but also as a multi-layered unit for causing an inorganic EL (electro-luminescence) device to emit light having high luminescence. Specifically, although an insulating layer having a high insulating property is necessary between the support substrate 2 and an inorganic EL device in order to cause the inorganic EL device to emit light having high luminescence, since a dielectric layer 3 of a dielectric material containing a bismuth layer structured compound having an improved c axis orientation has a high insulating property, it is possible to cause an inorganic EL device to emit light in a desired manner by disposing the inorganic EL device on the dielectric layer 3, disposing another electrode on the inorganic EL device and applying a voltage to the inorganic EL device.

According to the present invention, it is possible to provide a multi-layered unit suitable for fabricating a thin film capacitor having a small size, large capacitance and an excellent dielectric characteristic and suitable for fabricating an inorganic el (electro-luminescence) device capable of emitting light having high luminescence.

What is claimed is:

1. A multi-layered unit comprising a support substrate formed of a material which has conductivity and on which a dielectric material containing a bismuth layer structured compound can be epitaxially grown, at least the surface thereof being oriented in the [001] direction, and a dielectric layer formed by epitaxially growing a dielectric material containing a bismuth layer structured compound on the support substrate and formed of a dielectric material containing a bismuth layer structured compound oriented in the [001] direction.

2. A multi-layered unit in accordance with claim 1, wherein the support substrate is formed of at least one material selected from a group consisting of platinum (Pt), ruthenium (Ru), rhodium (Rh), palladium (Pd), iridium (Ir), gold (Au), silver (Ag), copper (Cu), nickel (Ni) and an alloy containing at least one of these metals as a principal component.

3. A multi-layered unit in accordance with claim 1, wherein the support substrate is formed of at least one single crystal material selected from a group consisting of conductive oxides having a perovskite structure and including $SrRuO_3$, $CaRuO_3$, $SrVO_3$, $SrCrO_3$, $SrCoO_3$, $LaNiO_3$ and Nb doped $SrTiO_3$, mixtures of these, and copper oxide superconductors having a $CuO_2$ plane and including BSCCO (bismuth strontium calcium copper oxide) represented by the stoichiometric compositional formula: $Bi_2Sr_2Ca_{n-1}Cu_nO_{2n+4}$ and YBCO (yttrium bismuth copper oxide) represented by the stoichiometric compositional formula: $YBa_2Cu_3O_7$-δ.

4. A multi-layered unit in accordance with claim 3, wherein the support substrate is formed by cutting the single crystal material at a plane oriented in the [001] direction.

5. A multi-layered unit in accordance with claim 1, wherein the support substrate is formed by orienting at least one polycrystal material selected from a group consisting of conductive oxides having a perovskite structure and including $SrRuO_3$, $CaRuO_3$, $SrVO_3$, $SrCrO_3$, $SrCoO_3$, $LaNiO_3$ and Nb doped $SrTiO_3$, mixtures of these, and copper oxide superconductors having a $CuO_2$ plane and including BSCCO (bismuth strontium calcium copper oxide) represented by the stoichiometric compositional formula: $Bi_2Sr_2Ca_{n-1}Cu_nO_{2n+4}$ and YBCO (yttrium bismuth copper oxide) represented by the stoichiometric compositional formula: $YBa_2Cu_3O_7$-δ in the [001] direction.

6. A multi-layered unit in accordance with claim 5, wherein the support substrate is formed by cutting the polycrystal material at a plane oriented in the [001] direction.

7. A multi-layered unit in accordance with claim 5, wherein the support substrate is formed by orienting the polycrystal material in the [001] direction so that the degree of the [001] orientation thereof is equal to or more than 90%.

8. A multi-layered unit in accordance with claim 1, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

9. A multi-layered unit in accordance with claim 2, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

10. A multi-layered unit in accordance with claim 3, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+1}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

11. A multi-layered unit in accordance with claim 4, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+1}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

12. A multi-layered unit in accordance with claim 5, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+1}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

13. A multi-layered unit in accordance with claim 6, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+1}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

14. A multi-layered unit in accordance with claim 7, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+1}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

15. A multi-layered unit in accordance with claim 8, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

16. A multi-layered unit in accordance with claim 9, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

17. A multi-layered unit in accordance with claim 10, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

18. A multi-layered unit in accordance with claim 11, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

19. A multi-layered unit in accordance with claim 12, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

20. A multi-layered unit in accordance with claim 13, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

21. A multi-layered unit in accordance with claim 14, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

* * * * *

UNITED STATES PATENT AND TRADEMARK OFFICE
CERTIFICATE OF CORRECTION

PATENT NO. : 6,930,875 B2
DATED : August 16, 2005
INVENTOR(S) : Yukio Sakashita

It is certified that error appears in the above-identified patent and that said Letters Patent is hereby corrected as shown below:

Column 15,
Lines 5, 20, 35 and 50, "$Bi_2A_{m-1}B_mO_{3m+1}$" should read -- $Bi_2A_{m-1}B_mO_{3m+3}$ --.

Signed and Sealed this

Fifteenth Day of November, 2005

JON W. DUDAS
*Director of the United States Patent and Trademark Office*